(12) United States Patent
Stranczl et al.

(10) Patent No.: US 9,310,771 B2
(45) Date of Patent: Apr. 12, 2016

(54) PALLET LEVER MECHANISM FOR TIMEPIECE ESCAPEMENT

(71) Applicant: NIVAROX-FAR S.A., Le Locle (CH)

(72) Inventors: Marc Stranczl, Nyon (CH); Thierry Hessler, St-Aubin (CH)

(73) Assignee: NIVAROX-FAR S.A., Le Locle (CH)

( * ) Notice: Subject to any disclaimer, the term of this patent is extended or adjusted under 35 U.S.C. 154(b) by 0 days.

(21) Appl. No.: 14/423,918

(22) PCT Filed: Nov. 6, 2013

(86) PCT No.: PCT/EP2013/073118
§ 371 (c)(1),
(2) Date: Feb. 25, 2015

(87) PCT Pub. No.: WO2014/072319
PCT Pub. Date: May 15, 2014

(65) Prior Publication Data
US 2015/0220061 A1  Aug. 6, 2015

(30) Foreign Application Priority Data
Nov. 9, 2012  (EP) .................................. 12192026

(51) Int. Cl.
*G04B 17/26* (2006.01)
*G04B 15/14* (2006.01)
(Continued)

(52) U.S. Cl.
CPC . *G04B 15/14* (2013.01); *C30B 1/10* (2013.01); *C30B 29/18* (2013.01); *G04B 15/12* (2013.01); *G04B 17/26* (2013.01)

(58) Field of Classification Search
CPC ........ G04B 17/26; G04B 17/20; G04B 15/12; C03B 1/10; C03B 29/18
See application file for complete search history.

(56) References Cited

U.S. PATENT DOCUMENTS

| 8,556,499 | B2* | 10/2013 | Queval | G04B 15/06 368/127 |
| 8,882,339 | B2* | 11/2014 | Colpo | G04B 15/06 368/127 |

(Continued)

FOREIGN PATENT DOCUMENTS

| CH | 703 333 | 12/2011 |
| EP | 1 666 990 | 6/2006 |

(Continued)

OTHER PUBLICATIONS

Translated claimed EP 2037335—worldwide.espacenet.com—Sep. 2, 2015.*
Translated description EP 2037335—worldwide.espacenet.com—Sep. 2, 2015.*
International Search Report Issued Apr. 29, 2014 in PCT/EP13/073118 Filed Nov. 6, 2013.

*Primary Examiner* — Sean Kayes
(74) *Attorney, Agent, or Firm* — Oblon, McClelland, Maier & Neustadt, L.L.P.

(57) ABSTRACT

A pallet lever mechanism for an escapement mechanism including a structure carrying a balance and an escape wheel, the pallet lever including pallet stones cooperating with the escape wheel, and a flexible, multistable element, and the pallet lever cooperates with the balance with horns of a first portion of the pallet lever connected by one such flexible element to the structure or to a second portion of the pallet lever carrying the pallet stones connected by one such flexible element to the fixed structure or to the first portion. One flexible element includes a prestressed beam buckled in an S or Z shape, the pallet lever mechanism including a pivot forcing the beam to have a node at the middle thereof.

20 Claims, 6 Drawing Sheets

(51) Int. Cl.
*G04B 15/12* (2006.01)
*C30B 1/10* (2006.01)
*C30B 29/18* (2006.01)

(56) References Cited

U.S. PATENT DOCUMENTS

| | | | |
|---|---|---|---|
| 9,075,394 B2* | 7/2015 | Stranczl | G04B 15/00 |
| 2008/0219103 A1* | 9/2008 | Baumberger | G04B 15/06 368/131 |
| 2010/0149926 A1* | 6/2010 | Colpo | G04B 15/06 368/127 |
| 2013/0070570 A1 | 3/2013 | Colpo et al. | |

FOREIGN PATENT DOCUMENTS

| | | |
|---|---|---|
| EP | 1 801 668 | 6/2007 |
| EP | 2 037 335 | 3/2009 |
| EP | 2 431 823 | 3/2012 |
| EP | 2 450 756 | 5/2012 |
| FR | 2 258 656 | 8/1975 |
| WO | 2011 120180 | 10/2011 |
| WO | 2013 144236 | 10/2013 |

* cited by examiner

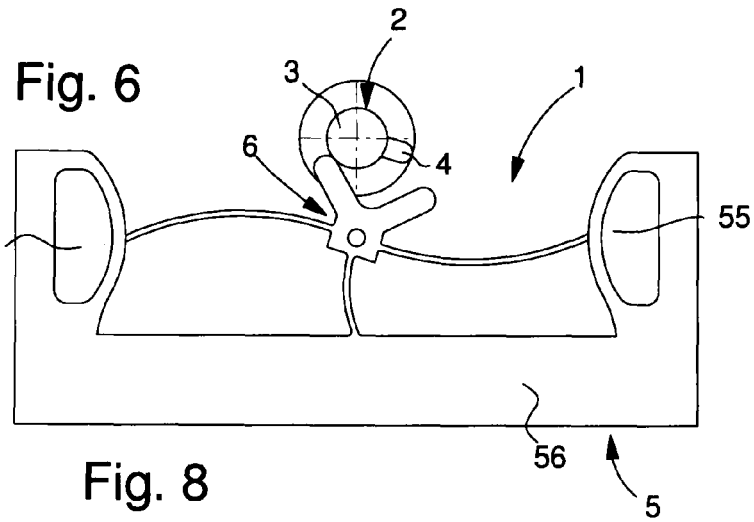
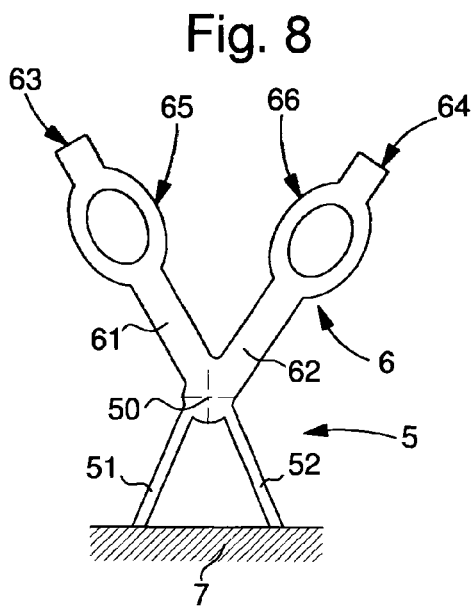
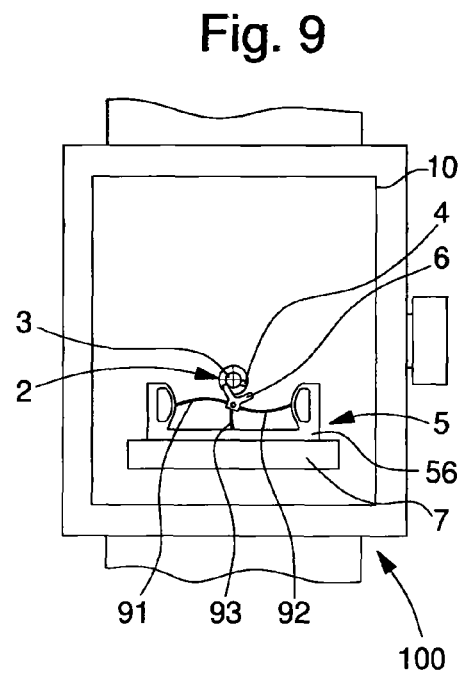
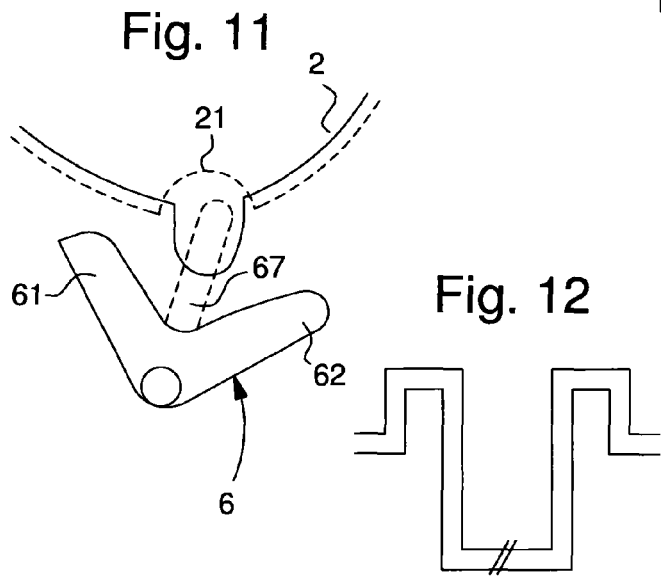
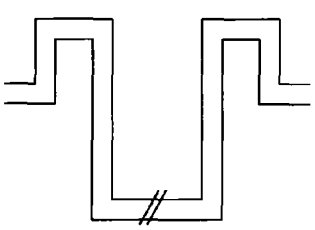
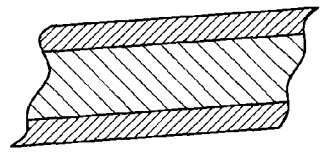

Fig. 6A
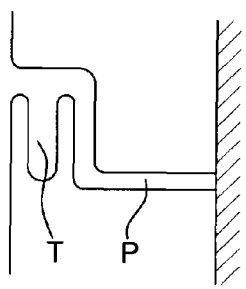
↓ +SiO₂
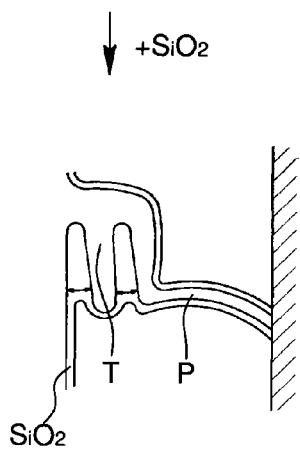
Fig. 6B
Fig. 7A
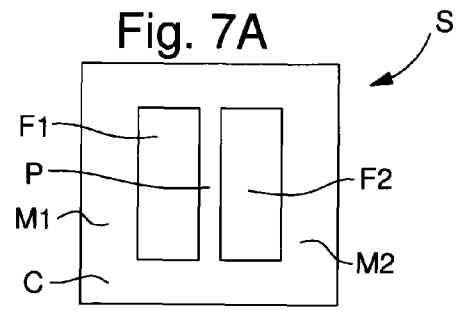
Fig. 7B
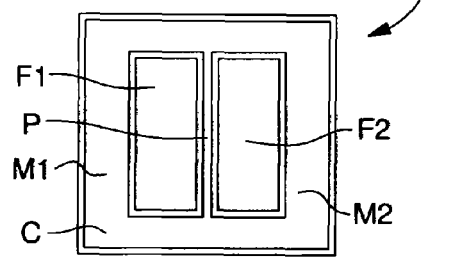
Fig. 7C
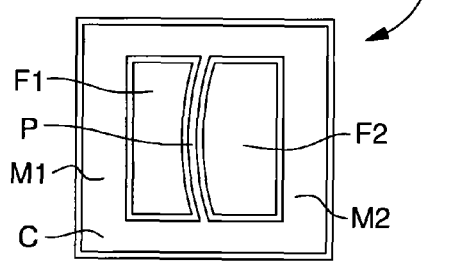
Fig. 7
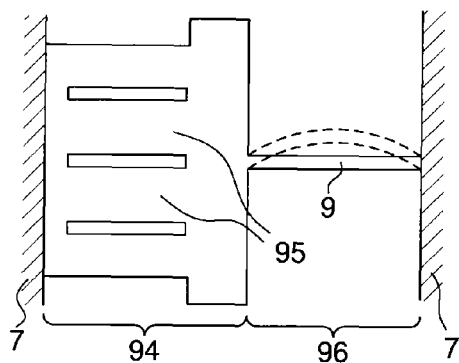
Fig. 10
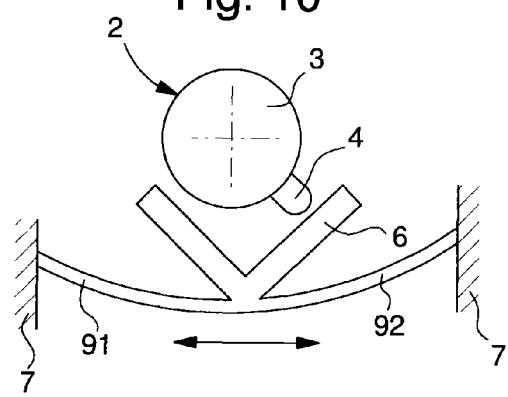

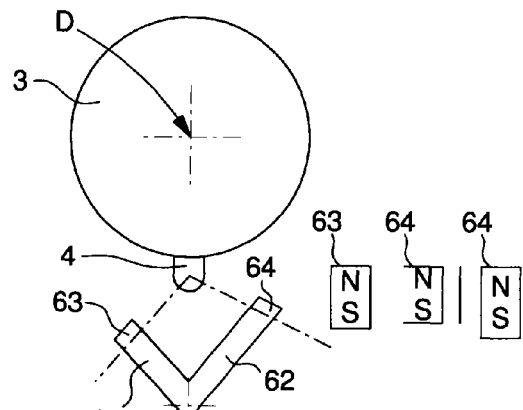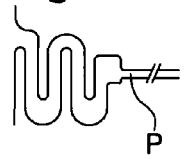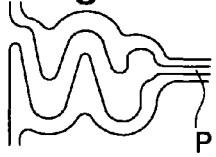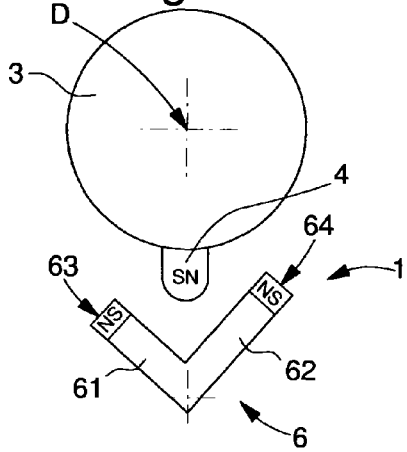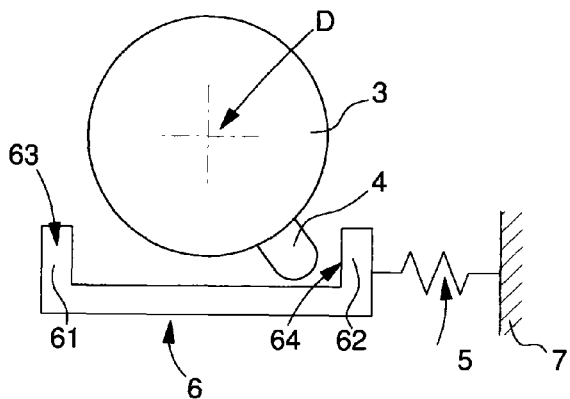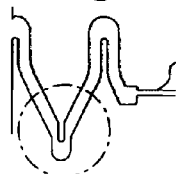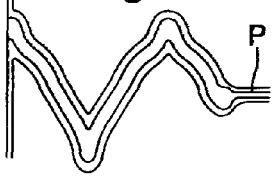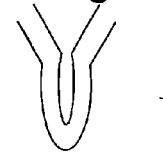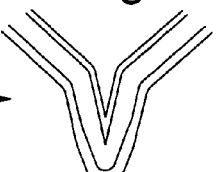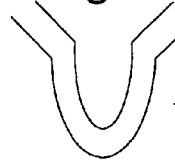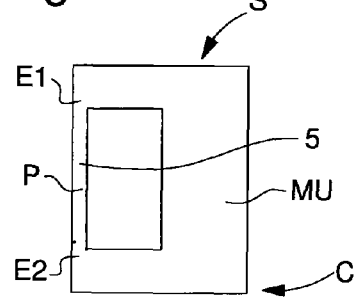

PALLET LEVER MECHANISM FOR TIMEPIECE ESCAPEMENT

CROSS-REFERENCE TO RELATED APPLICATIONS

This is a National Phase Application in the U.S. of International Patent Application PCT/EP2013/073118 filed Nov. 6, 2013 which claims priority on European Patent application 12192026.8 filed Nov. 9, 2012. The entire disclosures of the above patent applications are hereby incorporated by reference.

FIELD OF THE INVENTION

The invention concerns a pallet lever mechanism for an escapement mechanism including at least one fixed structure carrying a pair which includes a balance and an escape wheel cooperating with each other, said pallet mechanism cooperating with said pair to limit or transmit the angular travel of said balance and/or of said escape wheel, said pallet lever including pallet stones cooperating with said escape wheel and including at least one flexible, multistable element.

The invention also concerns a timepiece movement including at least one escapement mechanism with a regulating member comprising a balance, and which includes at least one pallet lever mechanism of this type.

The invention also concerns a timepiece or watch including at least one movement of this type, or at least one pallet lever mechanism of this type.

The invention concerns the field of timepiece escapement mechanisms.

BACKGROUND OF THE INVENTION

Improving rate and the search for improved efficiency are constant preoccupations of mechanical watch designers, who seek to obtain the greatest possible power reserve, combined with regularity, precision and security in the most difficult conditions of use. The regulating assembly, and the escape mechanism are at the heart of this problem.

In particular, in mechanical watches, escapements have to satisfy several safety criteria. One of the safety devices, the anti-trip mechanism, is designed to prevent the angular extension of the balance going beyond a normal angle of rotation.

EP Patent No 1801668 B1 in the name of Montres Breguet SA proposes a mechanism whose structure is characterized in that it includes a pinion mounted on the balance staff. This pinion meshes with a toothed wheel, at least one spoke of which abuts against a fixed stop if the balance is driven beyond its normal angle of rotation. However, this mechanism affects the inertia of the balance and may disturb its oscillations. Further, there is friction in the gear forming the mechanism which also disturbs the regulating mechanism.

EP Patent Application No 1 666990 A2 in the name of Montres Breguet SA discloses another anti-trip mechanism based on the expansion of the balance spring: a locking arm, fixed to the outer coil of the balance spring, is inserted between a finger integral with the balance and two columns integral with the balance bar. Locking only occurs in the event of excessive expansion of the balance spring beyond an angle exceeding its normal operating angle. This mechanism only limits the angle of rotation in one direction of rotation.

EP Patent Application No 2450756 A1 in the name of Nivarox discloses an anti-trip device for an escapement mechanism, with a pivoting wheel set carrying a finger which moves in a cam path integral with the balance. This pivoting wheel set may include an arm with a bistable lever, particularly an elastic bistable lever.

EP Patent Application No 2037335 A2 in the name of Enzler-Von-Gunten discloses a pallet lever which has two arms provided with pallet stones, and a pallet fork, the assembly being formed in a single piece with two flexible securing arms, which define a virtual pivot axis of the pallet lever, and allow the pallet lever to pivot when they bend, the median axes of these two strips intersecting on the virtual axis.

WO Patent application No 2011/120180A1 in the name of Rolex discloses a device for locking an escape wheel with a brake-lever having two pallet stones connected by two elastic elements to a frame to define a virtual pivot, and at least a third elastic element acting laterally on the brake-lever.

CH Patent Application No 703333A2 in the name of Fragniere discloses a pallet lever with a bistable return spring fixed to the lever arm between the fork and the pivot axis.

WO Patent No 2013/144236 in the name of Nivarox discloses a flexible escapement mechanism with a moving frame carried by flexible bistable strips.

EP Patent Application No 2431823A1 in the name of Blancpain discloses a lever escapement with opposing magnetised or electrized surfaces.

FR Patent Application No 2258656A1 in the name of FAR discloses a lever escapement with a click mechanism wherein flexible elements integral with the pallet lever are subjected to a magnetic field.

In short, known safety mechanisms each have at least one of the following recurrent drawbacks: disruption of oscillations by modifying the inertia of the regulating member, adversely affecting efficiency under the effect of friction, or limiting the angle of rotation in only one direction of rotation.

SUMMARY OF THE INVENTION

It is an object of the present invention to improve the efficiency of a watch and to overcome the aforementioned problems, with very little disruption of the oscillations of the balance, with negligible or zero loss of efficiency, and by limiting the angular travel of the balance in both directions of rotation.

The anti-trip mechanism according to the invention is based on a principle of storing the position of the balance similar to that of the Swiss lever: an element changes position when the balance passes and positions an anti-trip stop member, in the same manner, in the case of a Swiss lever, as the in and out banking pins or detent pins via the fork and the horns thereof.

To this end, the invention concerns a pallet lever mechanism for an escapement mechanism including at least one fixed structure carrying pair which includes a balance and an escapement wheel cooperating with each other, said pallet lever mechanism coopearting with said par to limit or to transmit the angular travel of said balance and/or of said escape wheel, said pallet lever including pallet stones cooperating with said escape wheel and including at least one flexible multistable element, characterized in that the cooperation of said pallet lever with said balance is achieved by means of horns of a first portion of said pallet lever, said first portion being connected by at least one said flexible element, either to said fixed structure, or to a second portion of said pallet lever carrying said pallet stones cooperating with said escape wheel, said second portion being connected by at least one said flexible element, either to said fixed structure, or to said first portion, characterized in that at least one said flexible element includes at least one prestressed beam buckled in a second mode wherein said beam adopts an S or Z shape, said pallet lever mechanism including a pivot forcing said beam to have a node at the middle thereof.

The invention further concerns a timepiece movement including at least one escapement mechanism which has a regulating member with a balance, and which includes at least one pallet lever mechanism of this type, characterized in that said movement has a structure which is either fixed to at least one flexible element of said pallet lever mechanism, or which is formed by said at least one flexible element.

The invention also concerns a timepiece or watch including at least one movement of this type, or at least one pallet lever mechanism of this type.

BRIEF DESCRIPTION OF THE DRAWINGS

Other features and advantages of the invention will appear upon reading the following detailed description, with reference to the annexed drawings, in which:

FIG. 6 illustrates a variant of FIG. 5 wherein prestressing is achieved by silicon oxide pouches in a silicon frame. FIGS. 6A and 6B illustrate, before and after oxidation of the silicon, a detail of an area with large differences in cross-section, and greatly modified after silicon dioxide is formed, and subjecting a straight beam of smaller cross-section to a buckling stress.

FIG. 7 illustrates another prestressing principle using the buckling resistance differential between a network of parallel oxidised silicon beams and a single prestressed buckled beam. FIGS. 7A, 7B, 7C illustrate successive steps in a method for oxidising and buckling a beam;

FIG. 8 illustrates a variant with anti-trip stop arms including flexible shock absorbing areas.

FIG. 9 shows a partial, schematic view of a timepiece in the form of a watch including a movement with an anti-trip device according to the invention.

FIG. 10 illustrates a configuration in which a virtual bistable pivot of the anti-trip mechanism is moveable in translation.

FIG. 11 illustrates a detail of an anti-trip mechanism including at least two levels for holding the arms of the anti-strip system in the plane of the balance pin: a first, upper level with arms cooperating with said pin, and a second, lower level with a guard pin cooperating with a notch of the balance.

FIG. 12 is a structure that can be deformed by silicon oxidation, in a variant of the FIG. 7A structure.

FIG. 13 shows the cross-section of a single crystal quartz structure, for creating an anti-trip mechanism according to the invention.

FIG. 14 illustrates a mechanism of the invention, having a repulsion function, between the balance pin and the arms of the anti-trip mechanism, performed by magnets located in a vertical orientation, and with a cross-section along the dotted line.

FIG. 15 illustrates a similar embodiment, oriented in the plane of the magnetic field.

FIG. 16 is a schematic view, similar to FIG. 10, of a more general case where the movement may be of any type and is bistable.

FIGS. 17A and 17B illustrate prestressing obtained by the encounter of oxide growths (before and after) in a coil.

FIGS. 18A and 18B (and the details thereof in FIGS. 19A and 19B) show prestressing obtained by opening the apex angles of a zig-zag profile during silicon oxide growth (before and after).

FIGS. 20A and 20B illustrate a variation in the angle obtained by varying (before and after) the radius of curvature of the oxidised walls in an area with a very low radius of curvature.

FIG. 21 is a schematic view of a flexible bistable strip cooperating with both ends of a single mass.

DETAILED DESCRIPTION OF PREFERRED EMBODIMENTS

Figure 1:
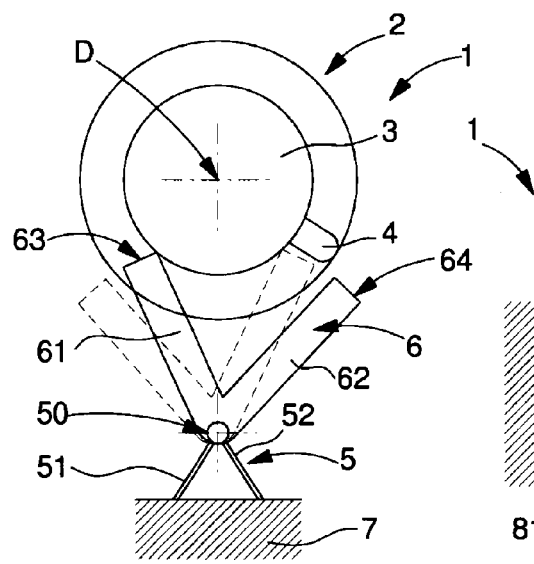
FIG. 1 shows a schematic front view of a timepiece limiter or transmission mechanism according to the invention, made in the form of an anti-trip mechanism according to the invention, fixed to a structure of a movement and cooperating alternately via one of several arms comprised therein, two in this illustration, with a pin of a balance.

The invention concerns a timepiece limiter or transmission mechanism 1000 for limiting or transmitting the angular travel of a wheel set 2000 of a timepiece movement 10, said wheel set 2000 including at least one projecting pin or tooth 4000, particularly a radially projecting tooth 5001 or axially projecting pin 4. According to the invention, this timepiece limiter or transmission mechanism 1000 includes limiting or transmission means 6000 which are fixed, via at least one multi-stable flexible element, in particular a bistable element 5, to another component of movement 10 or to a rigid structural element 7 of movement 10.

In a particular application, this timepiece limiter or transmission mechanism 1000 is an anti-trip mechanism 1, which is intended to prevent a timepiece balance 2 racing. The balance includes a staff 3 and a pin 4 or a similar element projecting from said staff 3.

According to the invention, anti-trip mechanism 1 includes at least one single-piece, flexible, bistable element, which will be designated hereinafter "flexible bistable element 5" carrying at least one anti-trip stop member 6 and which is fixed, via flexible and elastic connecting elements, to a rigid structural element 7, such as a bottom plate, bar or similar of a timepiece movement 10 in which is embedded a regulating member comprising balance 2.

In a particular variant, this structure 7 contains a system of self-alignment with the staff of balance 2.

This flexible bistable element 5 carries at least one anti-trip stop member 6, one end 63 or 64 of which may, according to the angular position of balance 2, interfere with the trajectory of pin 4, and perform the function of a stop member if balance 2 exceeds its normal angular travel.

FIG. 1 sets out a flow diagram, in a particular, preferred but non-limiting application, wherein flexible bistable element 5 and the at least one anti-trip stop member 6 together form a monolithic component. In this non-limiting example, anti-trip stop member 6 includes two arms 61, 62, whose respective ends 63, 64 can each, according to the position of balance 2, interfere with the trajectory of pin 4, and perform the function of a stop member if balance 2 exceeds its normal angular travel. This embodiment with two arms, as illustrated, limits the angle of rotation of balance 2 in both directions of rotation of said balance. FIG. 1 shows, in dotted lines, a position of interference with balance 2, limiting the angular travel thereof.

Flexible bistable element 5 is illustrated here in a particular, non-limiting case, with these flexible, elastic connecting elements which are formed by at least two thin strips 51, 52, each fixed at a first end to structure 7 and connected via a second end to the body of the flexible element. In the particular case of FIG. 1, the two thin strips 51, 52 are connected via the second ends thereof to the body of the flexible element in a V shape, so as to define a virtual pivot 50 about which anti-trip stop member 6 can pivot. Thus, in the case of FIGS. 1 and 2, flexible bistable element 5 according to the invention is a flexible bistable pivot. This embodiment is not exclusive, FIG. 10 is a diagram of the case where anti-trip stop member 6 is moveable in translation. FIG. 16 illustrates a more general case where the movement may be of any type and is bistable.

Preferably, at least two flexible elements 5, particularly two flexible strips 51, 91, 52, 92 are mounted prestressed and buckled relative to structure 7 or relative to a frame 56 of flexible bistable element 5.

Figure 3:
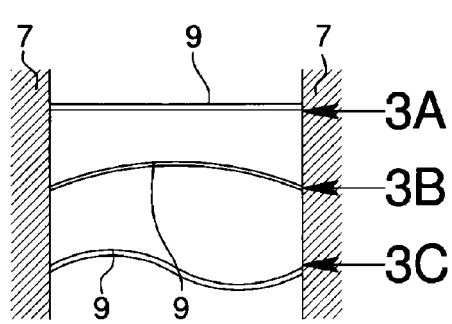
FIG. 3 shows a schematic view of three states of an embedded beam: at rest in FIG. 3A, in a first C shape buckling mode in FIG. 3B, and in a second S or Z shape buckling mode in FIG. 3C.

Each of flexible elements 5 or strips 51, 52 can occupy several states, depending on the stresses to which it is subjected. Each of these strips is calculated to work by buckling, and may adopt several geometries, according to the buckling mode, as seen in FIG. 3: at rest in FIG. 3A, in a first buckling mode, with a C shaped concave or convex form in FIG. 3B, in a second buckling mode with an S or Z shape in FIG. 3C. Flexible bistable element 5 may include flexible elements whose shapes are different to the flexible strips 51, 52, illustrated here, without departing from the invention.

Flexible bistable element 5 may also, in a particular embodiment, be made in a single piece with structural element 7.

In a particular embodiment, illustrated in FIG. 8, flexible elements 65, 66 may be included in arms 61, 62 of stop member 6 of anti-trip mechanism 1 to prevent excessive shocks.

This flexible bistable element 5 may be made in silicon technology, "LIGA", MEMS or similar. It has very low inertia compared to that of balance 2, and actuation thereof barely disrupts the oscillations of balance 2.

Figure 2:
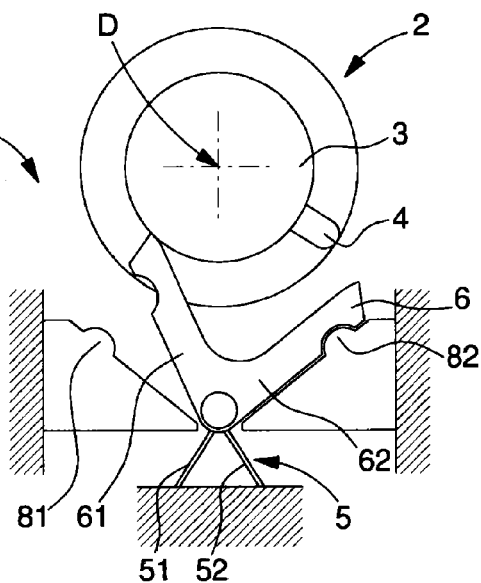
FIG. 2 shows a similar view to FIG. 1 of the same mechanism supplemented by a shock absorber mechanism.
Figure 5:
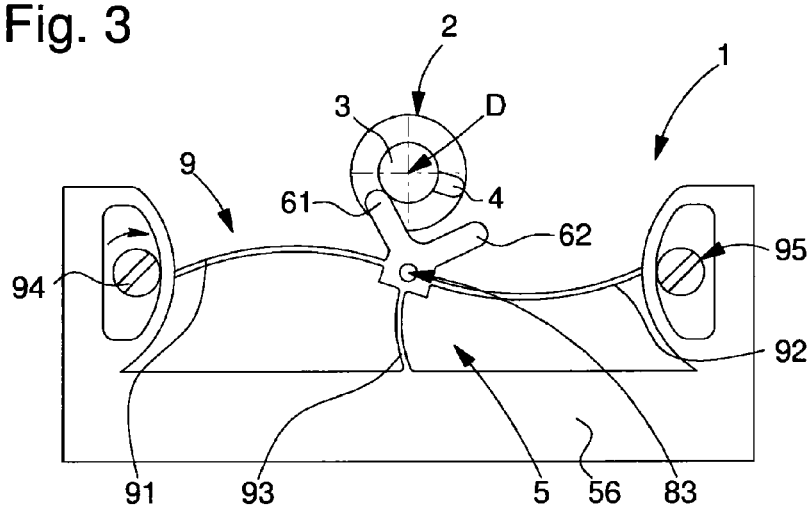
FIG. 5 shows a schematic front view of an embodiment of the invention according to the principle of FIG. 4, with the beam prestressed and buckled by eccentric screws, and in a single piece embodiment.
Figure 22:
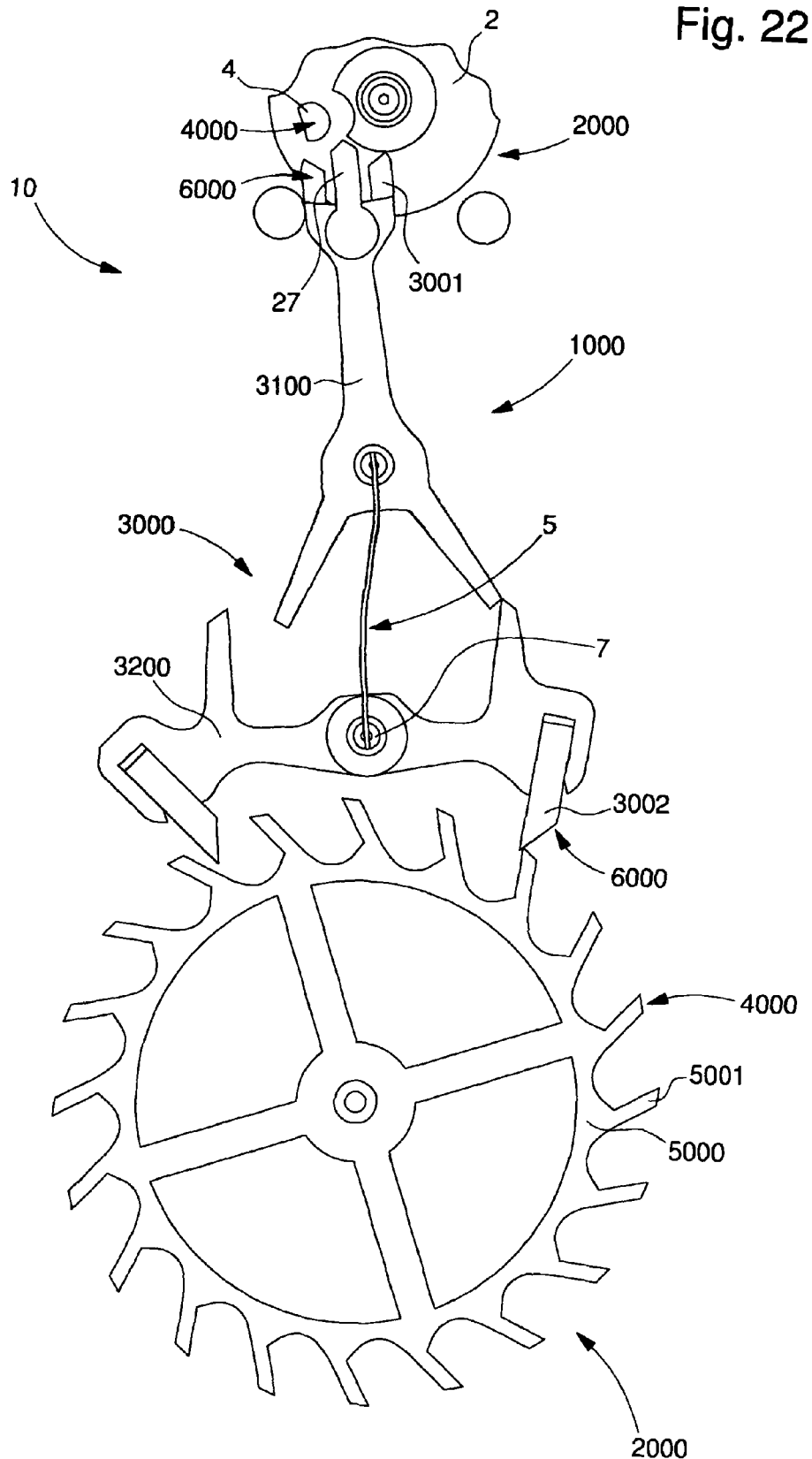
FIG. 22 illustrates a plan view of another application wherein the timepiece limiter or transmission mechanism is a pallet lever mechanism between a balance and an escape wheel.

FIG. 2 illustrates a shock absorber mechanism for protecting flexible strips 51 and 52 of flexible bistable element 5. This mechanism is useful, or even necessary, in cases where anti-trip stop members 6 have to limit the amplitude of balance 2. The purpose thereof is to absorb shocks in shock absorber stop members 81, 82, which cooperate in abutment with arms 61, 62 and not to transmit these shocks to flexible arms 51, 52 to avoid breaking said arms. FIG. 5 shows a shock absorber stop member 83 coaxial with the flexible pivot. In this example embodiment, the shock absorber stop members 81 and 82 include substantially cylindrical protuberances, which cooperate with grooves of substantially complementary shape in arms 61 and 62.

Flexible bistable pivot 5 may be made in accordance with several principles. FIG. 3 introduces the principle of a bistable state considered in this particular case. Use is made of the natural buckling modes of a beam 9 subjected to a stress, more particularly the second mode illustrated in FIG. 3C.

Figure 4:
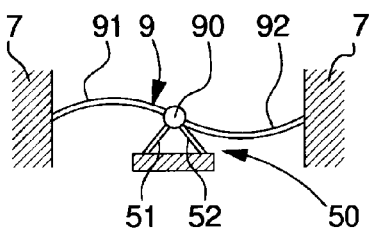
FIG. 4 shows a schematic front view of an embedded, prestressed beam, buckled in the second mode of FIG. 3C under the action of a flexible pivot.

As shown in FIG. 4, in an advantageous embodiment, in order to force beam 9 to buckle in the second mode, a pivot 90 forces beam 9 to have a node at the middle thereof (centre of rotation of the added pivot). The "middle" means an intermediate point between the ends of beam 9 and not the strict geometrical middle which represents only one particular variant. The centre of rotation 50 of bistable pivot 5 then matches the centre of rotation of the added pivot 90.

FIG. 5 shows a complete anti-trip mechanism 1 made in accordance with this principle. Flexible bistable pivot 5 includes at least one prestressed beam 9 buckled in a second mode where beam 9 adopts an S or Z shape, a pivot 90 forcing said beam 9 to have a node in the median area, preferably in the middle thereof. Preferably in the case of FIG. 5, flexible bistable pivot 5 is made by buckling two prestressed beams 91 and 92 (which together form beam 9) by stressing them here using two eccentric screws 94 and 95. A third beam 93 fixed to structure 7 or to a frame 56 of flexible bistable element 5, forces beam 9, formed of beams 91 and 92, to deform in the second mode, and plays the part of pivot 90 of FIG. 4. Shock absorber stop member 83 is located in the centre of rotation 50 of flexible bistable pivot 5.

FIG. 11 illustrates an anti-trip stop member 6 including at least two levels for holding arms 61, 62 of the anti-trip system in the plane of balance pin 4: a first top level with arms 61 and 62 cooperating with pin 4 and a second lower level with a dart 67 cooperating with a notch 21 of balance 3.

To remove any contacts or decrease any contact pressure, anti-trip mechanism 1 according to the invention may also advantageously include means for creating a repulsion force or torque between balance 2 and arms 61, 62 of anti-trip mechanism 1.

FIG. 14 illustrates the case where this repulsion function is performed by magnets located in a vertical orientation, on pin 4 and ends 63, 64 of arms 61, 62. FIG. 15 illustrates a similar embodiment, with orientation in the plane of the magnetic field; the north and south poles of these magnets are shown.

In a similar location, in place of magnets, or in addition thereto, electrets may be used (electrostatic charges) to exert these repulsion forces.

This is to increase the efficiency of anti-trip mechanism 1 and to disturb as little a possible the operation of balance 2. The operation of anti-trip mechanism 1 is as follows:
  when tipping, in a first phase, balance 2 supplies energy to flexible bistable element 5;
  once past the point of equilibrium, in a second phase, the mechanism returns part of the energy to balance 2 making a small impulse.

The mechanism operates in a similar manner to the horns of a Swiss lever; there is a release and then an impulse.

In a particular embodiment, balance 2 and/or at least arms 61, 62 of anti-trip stop member 6, or the entire anti-trip mechanism 1 when it is in a single piece, in an advantageous embodiment, is made in silicon technology from a silicon wafer, with or without silicon oxide growth, and with a surface layer containing, according to the case, either magnets or magnetic particles on the one hand, or electrets on the other hand. This particular layer may be created by a galvanic method, or by cathodic sputtering, or by another suitable micro-technical structuring method.

In the preferred case where flexible bistable element 5 is produced in silicon technology, the creation of stresses in the strips forming beams 91 and 92 may occur via silicon oxidation. Indeed, silicon oxide takes up a larger volume when it is grown from silicon, as seen in FIG. 6, where pockets 54, 55 of SiO2 are created in a silicon frame 56. The example of FIG. 5 or 6 shows that this frame 56 may also form structure 7, or be connected thereto in a very simple manner by any ordinary mechanical securing technology.

FIGS. 6A and 6B illustrate, before and after silicon oxidation, a detail of an area having large differences in cross-section, which is greatly modified after silicon dioxide has formed, subjecting to a buckling stress a straight beam P of smaller cross-section than a head T of which the beam forms an extension.

Another means of achieving buckling stresses in these strips is by oxidation of a silicon structure of particular shape, as shown in FIG. 7. Silicon oxidation creates surface stresses which have the effect of increasing the length of an oxidised beam. FIG. 7 illustrates another prestressing principle using the buckling resistance differential between a network of parallel oxidised silicon beams and a single prestressed buckled beam, and shows a simple mechanism wherein, in the left part, a parallel structure 94 has a set of parallel beams 95 which, after oxidation (in dotted lines), will force to buckle and bend, in the right part, a flexible element to be stressed 9, in this case a beam 9, 91, 92 or similar, which is required to be deformed, the buckling resistance of parallel structure 94 being much greater than that of the flexible element to be stressed 96. FIGS. 7A, 7B, 7C illustrate successive steps in a method of oxidising and buckling a beam P arranged between two apertures F1, F2 in a frame C. FIG. 7A shows the basic structure resulting from silicon etch shaping, at the moment when it is placed in a furnace. FIG. 7B illustrates the development of silicon oxide $SiO_2$ inside apertures F1 and F2 and thus on the sides of beam P, by keeping the structure at 1100° C. for several hours; in a known manner, the growth of silicon dioxide $SiO_2$ occurs via the partial consumption of silicon towards the exterior of the component, and consequently in thin beam P, the proportion of silicon dioxide $SiO_2$ increases when the proportion of silicon decreases, over time during this treatment at 1100° C. FIG. 7C shows the contraction of the structure after cooling to ambient temperature, around 20° C. The lateral members M1, M2 of frame C, parallel to beam P, which are essentially formed of silicon and a little silicon dioxide, contract more than beam P, which is then essentially formed of silicon dioxide which has a lower expansion coefficient than silicon. Consequently, beam P is subjected to a buckling stress and takes a bistable state.

Another variant is illustrated in FIG. 12.

FIGS. 17A and 17B also illustrate the prestress obtained by the encounter of oxide growths in a coil.

FIGS. 18A and 18b (and the details thereof in FIGS. 19A and 19B) show prestressing obtained by opening the apex angles of a zig-zag profile in accordance with the same principle: the growth of silicon oxide forces these angles to open, and the movement is amplified by the Z or zig-zag geometry of the structure. FIGS. 20A and 20B show the angle variation obtained by varying the radius of curvature of the oxidised walls in an area having a very low radius of curvature.

Thus, the invention also concerns a method whereby a flexible bistable strip is formed.

In a first variant, illustrated in FIG. 21, a flexible bistable strip 5 cooperates with both ends E1, E2 of at least one mass, and in particular a single mass MU. The method then includes the following series of operations:

a silicon component S is etched in which a slender beam P of small section forms the connection between two ends E1, E2 of at least one mass MU of large cross-section (at least ten times greater than said small cross-section), said at least one mass MU forming a rigid frame C;

this component S is subjected, in a furnace, to a known silicon dioxide $SiO_2$ growth method by maintaining a temperature of 1100° C. for several hours;

this duration of several hours is adjusted so that the first ratio RA between the section of beam P formed of silicon dioxide $SiO_2$ and the section of beam P formed of silicon is more than 1; the silicon can then be completely oxidised in beam P which becomes flexible element 5. A second ratio RB between the section of mass MU formed of silicon dioxide $SiO_2$ and the section of mass MU formed of silicon is much lower than the first ratio RA. The RA/RB ratio is comprised between 2 and 1000 and preferably between 10 and 1000 and, in a preferred application, is more than 100.

cooling is performed to ambient temperature, around 20° C. so as to deform beam P by buckling during the cooling of the at least one mass MU, whose contraction during cooling is greater than the contraction of beam P. FIGS. 7A, 7B, 7C illustrate a second variant implementation of a method for creating a flexible bistable strip, involving at least two masses. This method includes the following series of operations:

A silicon component S is etched in which a slender beam P of small cross-section forms the connection between at least two masses M1, M2 each of large cross-section (at least ten times greater than the small cross-section), said two masses M1, M2 forming together, or with other structural elements, a rigid frame C;

this component S is subjected, in a furnace, to a known silicon dioxide $SiO_2$ growth method by maintaining a temperature of 1100° C. for several hours;

this duration of several hours is adjusted so that the first ratio RA between the section of beam P formed of silicon dioxide $SiO_2$ and the section of beam P formed of silicon is more than 1; the silicon can then be completely oxidised in beam P which becomes flexible element 5. A second ratio RB between the section of each of masses M1. M2 formed of silicon dioxide SiO2 and the section of the corresponding mass formed of silicon is much lower than the first ratio RA. The RA/RB ratio is comprised between 2 and 1000 and preferably between 10 and 1000 and, in a preferred application, is more than 100.

cooling is performed to ambient temperature, around 20° C., so as to deform beam P by buckling during the cooling of the two masses M1 and M2, whose contraction during cooling is greater than the contraction of beam P.

In another variant embodiment, the structure of anti-trip mechanism 1 is made of single crystal quartz. As shown in FIG. 13, the top and bottom surfaces of the central single crystal quartz core are coated with a deposition made at a higher temperature than the ambient temperature, with a coefficient $\alpha$ lower than the coefficient $\alpha_{x,y}$ of quartz. This quartz coefficient $\alpha_{x,y}$ is 7.5 ppm/° C.

The anti-trip mechanism 1 illustrated here limits the direction of rotation of the balance in both directions of rotation. It only very slightly disturbs the oscillations of balance 2.

The invention may be used in watch mechanisms which do not have an anti-trip mechanism.

In another particular application, this timepiece limiter or transmission mechanism 1000 is a pallet lever mechanism 3000 for an escape mechanism, in particular, but not restrictively, a Swiss lever, with the same principle, for cooperation with a balance 2 and with an escape wheel 5000. This pallet lever 3000 including pallet stones 3002 cooperating with teeth 5001 of escape wheel 5000 includes at least one flexible, multistable and notably bistable element 5. The lever may be made in a flexible lever embodiment having constant force in accordance with EP Patent Application No 12183559.9 of the same Applicant. The cooperation of pallet lever 3000 with balance 2 is achieved by means of horns 3001 similar to the ends 63, 64 of arms 61 and 62 of the anti-trip stop member 6 described above, horns 3001 are carried by a first portion 3100 of pallet lever 3000. This first portion 3100 is connected by at least one flexible element 5, in particular a flexible, multistable, notably bistable strip 5, either to a fixed structure 7, or preferably to a second portion 3200 of the pallet lever which carries pallet stones 3002 cooperating with the teeth 5001 of escape wheel 5000. Likewise, these pallet stones 3002 are advantageously formed in a similar manner to arms 61 and 62, and are connected by at least one flexible, multistable, and notably bistable strip 5, either to a fixed structure 7, or preferably to first portion 3100 of the pallet lever including horns 3001. In this variant, first portion 3100 and second portion 3200 each have their own movement, their kinematic connection being advantageously limited to one or more flexible elements 5.

In a particularly advantageous manner, to improve rate and efficiency, the interaction between horns 3001 and balance 2 on the one hand, and/or pallet stones 3002 and escape wheel 5000 on the other hand, is achieved with no contact or with attenuated contact, and, for this purpose, the affected surfaces of horns 3001 and/or pallet stones 3002 are magnetised or electrized to cooperate in repulsion with opposing surfaces of the balance and/or respectively of the escape wheel, which are made of suitable material and/or are advantageously magnetised or respectively electrized in a complementary manner. Patent Application No PCT/EP2011/057578 in the name of the Swatch Group Research and Development Ltd discloses this type of contactless or attenuated contact transmission, the combination of which with a mechanism having a flexible multi-stable strip, particularly a pallet lever, provides the advantages required.

More specifically, this pallet lever mechanism 300 is provided for an escapement mechanism 7000 which includes at least one fixed structure 7 carrying a pair 7100, said pair 7100 includes a balance 2 and an escape wheel 5000 cooperating with each other. The pallet lever mechanism 3000 cooperates with pair 7100 to limit or to transmit the angular travel of balance 2 and/or escape wheel 5000.

According to the invention, this pallet lever 3000 includes at least one flexible, multistable 5. The cooperation of pallet lever 3000 with balance 2 is achieved by means of horns 3001 of a first portion 3100 of pallet lever 3000. The first portion 3100 is connected by a flexible element 5 of this type to fixed structure 7 or to a second portion 3200 of pallet lever 3000 including pallet stones 3002 cooperating with escape wheel 5000. The second portion 3200 is connected by a flexible element 5 of this type, which may be the same as that of first portion 3100 or another flexible element, to fixed structure 7 or to first portion 3100.

In an advantageous manner in a particular version, the interaction between horns 3001 and balance 2 on the one hand, and/or between pallet stones 3002 and escape wheel 5000 on the other hand, is achieved with no contact or with attenuated contact. In an advantageous variant, first surfaces of horns 3001 and/or of pallet stones 3002 are magnetised or electrized to cooperate in repulsion with second opposing surfaces of balance 2 and/or respectively of escape wheel 5000, which are made of a suitable material, and/or magnetised or respectively electrized in a complementary manner.

In a particular variant, the interaction between horns 3001 and balance 2 on the one hand, and/or between pallet stones 3002 and escape wheel 5000 on the other hand, is achieved with no contact.

In a particular variant, the first surfaces of horns 3001 and/or pallet stones 3002 are magnetised to cooperate in repulsion with second opposing surfaces of balance 2 and/or respectively of escape wheel 5000, which are magnetised in a complementary manner.

In a particular variant, the first surfaces of horns 3001 and/or pallet stones 3002 are electrized to cooperate in repulsion with second opposing surfaces of balance 2 and/or respectively of escape wheel 5000, which are electrized in a complementary manner.

In a particular variant, at least one flexible, multistable element 5 is mounted prestresed and buckled relative to structure 7.

Figure 23:
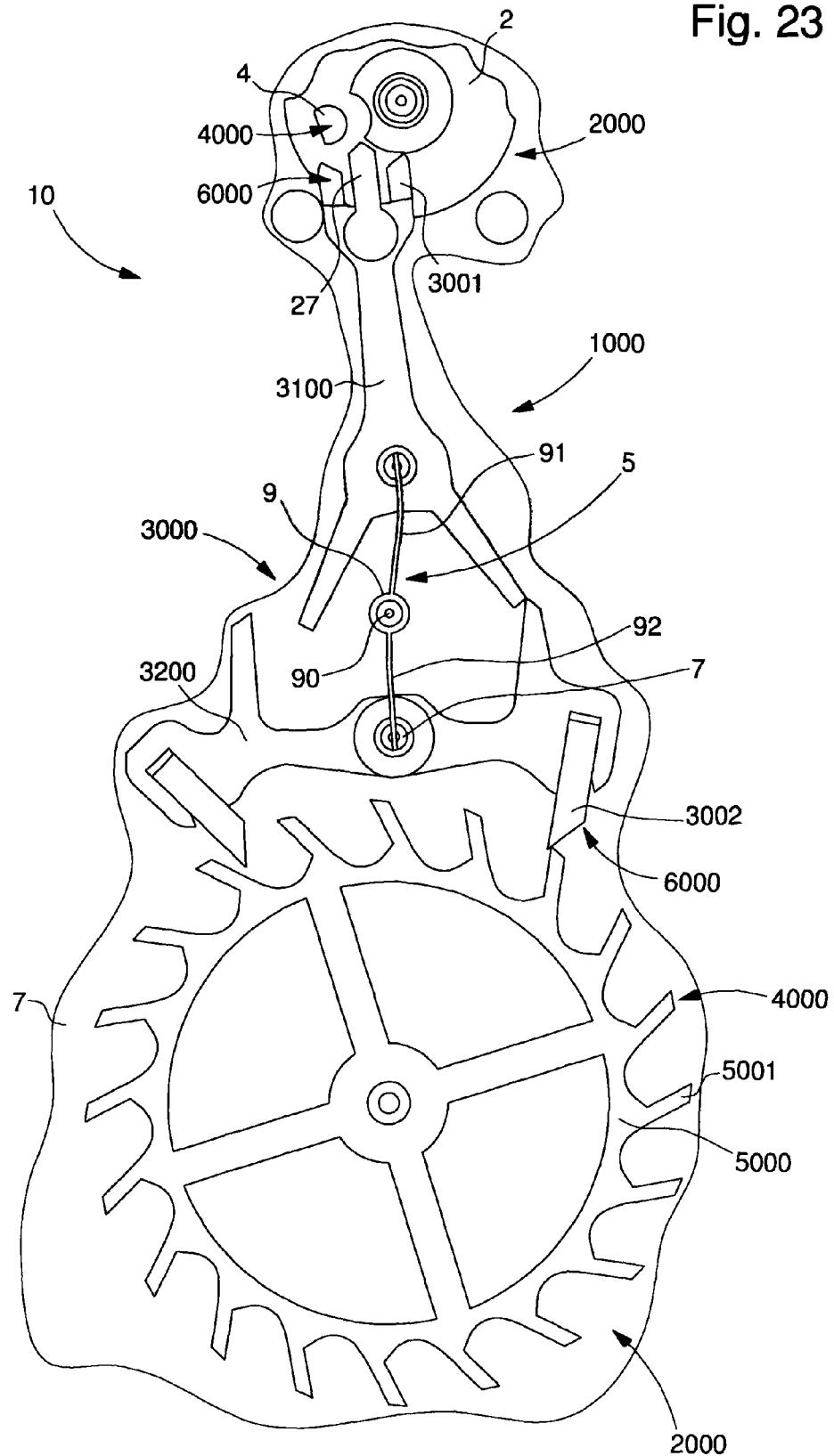
FIG. 23 illustrates a variant of FIG. 22 where a flexible connecting strip between two portions of the pallet lever is pivoted at an intermediate point from its ends.

In a particular variant, at least one flexible element 5 includes at least one prestressed beam 9 buckled in a second mode wherein beam 9 adopts an S or Z shape, pallet lever mechanism 3000 then including a pivot 90 forcing beam 9 to have a node at the middle thereof, as seen in FIG. 23.

In a particular variant, at least one flexible element 5 includes two prestressed buckled beams 91, 92. A third beam 93 fixed to structure 7 forces beam 9 formed of these two beams 91, 92 to deform in this second embodiment, and this third beam 93 forms pivot 90.

In a particular variant, at least one flexible element 5 is made of silicon, and includes a frame 56 including silicon oxide $SiO_2$ pouches 54, 55 which prestress the two beams 91, 92.

In a particular variant, at least one flexible element 5 includes at least one prestressed beam 9, 91, 92 buckled in a second mode wherein beam 9, 91, 92 adopts an S or Z shape. This flexible bistable beam 5 is made of silicon and includes a parallel structure 94 including a set of parallel beams 95 which are oxidised (i.e. have undergone swelling due to the silicon oxidation) and ensure the buckled bending of a flexible element to be prestressed 96 formed by at least one beam 9, 91, 92, the buckling resistance of this parallel structure 94 being much greater than that of the flexible element to be prestressed 96.

In a particular variant, at least one flexible element 5 is made in a single piece with structural element 7.

In a particular variant, at least one flexible element 5 is a flexible strip.

In a particular variant, the structure of first portion 3100 and/or second portion 3200 of pallet lever 3000 includes a central single crystal quartz core, the upper and lower surfaces of which are coated with a deposition having a coefficient $\alpha$ lower than the coefficient $\alpha_{x,y}$ of quartz which is 7.5 ppm/° C.

The invention further concerns a timepiece movement 10 including at least one regulating member with a balance 2, and which includes at least one timepiece limiter or transmission mechanism 1000 according to the invention, particularly a pallet lever mechanism 3000. According to the case, either movement 10 includes a structure 7 which is fixed to a flexible, bistable element 5 of said timepiece limiter or transmission mechanism 1000 or said flexible bistable element 5 actually forms this structure 7.

The invention also concerns a timepiece 100, in particular a watch, including at least one movement 10 of this type, or at least one timepiece limiter or transmission mechanism 1000 of this type, particularly a pallet lever mechanism 3000.

Equivalent mechanisms based on conventional pivots and springs corresponding to the flexible bistable pivots are considered to form part of the present invention.

The technologies used to make the device are not limited to silicon technology but also include "LIGA", "DRIE", "MEMS" and other micro-manufacturing methods.

The invention claimed is:

1. A pallet lever mechanism for an escape mechanism, comprising:
at least one fixed structure carrying a balance and an escape wheel cooperating with each other, the pallet lever mechanism configured to limit or to transmit angular travel of the balance and/or of the escape wheel, the pallet lever mechanism including pallet stones cooperating with the escape wheel, and at least one flexible, multistable element,
wherein cooperation of the pallet lever with the balance is achieved by horns of a first portion of the pallet lever mechanism, the first portion being connected by the at least one flexible element to a second portion of the pallet lever mechanism carrying the pallet stones, the at least one flexible element including at least one prestressed beam buckled in a mode wherein the beam adopts an S or Z shape, and the pallet lever mechanism including a pivot forcing the beam to have a node at the middle thereof, and
wherein interaction between the horns and the balance, and/or the pallet stones and the escape wheel, is achieved with no contact or with attenuated contact, and wherein first surfaces of the horns and/or of the pallet stones are magnetized or electrized to cooperate in repulsion with opposing second surfaces of the balance and/or respectively of the escape wheel, which are made of suitable material and/or are magnetized or respectively electrized in a complementary manner.

2. The pallet lever mechanism according to claim 1, wherein interaction between the horns and the balance, and/or between the pallet stones and the escape wheel, is achieved with no contact.

3. The pallet lever mechanism according to claim 1, wherein the first surfaces of the horns and/or of the pallet stones are magnetized to cooperate in repulsion with second opposing surfaces of the balance and/or respectively of the escape wheel, which are magnetized in a complementary manner.

4. The pallet lever mechanism according to claim 1, wherein the first surfaces of the horns and/or of the pallet stones are electrized to cooperate in repulsion with the second opposing surfaces of the balance and/or respectively of the escape wheel, which are electrized in a complementary manner.

5. The pallet lever mechanism according to claim 1, wherein the at least one flexible element is mounted prestressed and buckled in relation to the structure.

6. The pallet lever mechanism according to claim 1, wherein the at least one flexible element includes two prestressed buckled beams, and a third beam fixed to the structure forces the beam formed of the two beams to deform in the second mode, and wherein the third beam forms the pivot.

7. The pallet lever mechanism according to claim 6, wherein the at least one flexible element is made of silicon, and includes a frame including pouches of silicon oxide $SiO_2$ which prestress the two beams.

8. The pallet lever mechanism according to claim 1, wherein the at least one flexible element is made of silicon, and includes a parallel structure including a set of parallel beams which are oxidized and ensure bending and buckling of a flexible element to be prestressed formed by at least one the beam, buckling resistance of the parallel structure being greater than that of the flexible element to be prestressed.

9. The pallet lever mechanism according to claim 1, wherein the at least one flexible element is made in a single piece with the structure.

10. The pallet lever mechanism according to claim 1, wherein the at least one flexible element is a flexible strip.

11. The pallet lever mechanism according to claim 1, wherein a structure of the first portion and/or of the second portion of the pallet lever mechanism includes a central single crystal quartz core, which is coated on the upper and lower surfaces thereof with a deposition having a coefficient $\alpha$ lower than the coefficient $\alpha_{x,y}$ of quartz, which is 7.5 ppm/° C.

12. The pallet lever mechanism according to claim 1, wherein the at least one flexible element is only one flexible element.

13. The pallet lever mechanism according to claim 12, wherein the one flexible element includes a single one of said beam.

14. A timepiece movement comprising at least one escapement mechanism with a regulating member having a balance, and which includes at least one pallet lever mechanism according to claim 1, and wherein the movement includes a structure, which is either fixed to one of the at least one flexible element of the pallet lever mechanism, or which is formed by one of the at least one flexible element.

15. A timepiece or watch comprising at least one movement according to claim 14.

16. A pallet lever mechanism for an escapement mechanism comprising:
at least one fixed structure carrying a balance and an escape wheel cooperating with each other, the pallet lever mechanism configured to limit or to transmit angular travel of the balance and/or of the escape wheel, the pallet lever mechanism including pallet stones cooperating with the escape wheel, and at least one flexible, multistable element,
wherein cooperation of the pallet lever mechanism with the balance is achieved by horns of a first portion of the pallet lever mechanism, the first portion being connected by the at least one flexible element to a second portion of the pallet lever mechanism carrying the pallet stones, the at least one flexible element including at least one prestressed beam buckled in a mode wherein the beam adopts an S or Z shape, and the pallet lever mechanism including a pivot forcing the beam to have a node at the middle thereof, and
wherein the at least one flexible element is mounted prestressed and buckled in relation to the structure.

17. A pallet lever mechanism for an escapement mechanism comprising:
at least one fixed structure carrying a balance and an escape wheel cooperating with each other, the pallet lever mechanism configured to limit or to transmit angular travel of the balance and/or of the escape wheel, the pallet lever mechanism including pallet stones cooperating with the escape wheel, and at least one flexible, multistable element, and
wherein cooperation of the pallet lever mechanism with the balance is achieved by horns of a first portion of the pallet lever mechanism, the first portion being connected by the at least one flexible element to a second portion of the pallet lever mechanism carrying the pallet stones, the at least one flexible element including at least one prestressed beam buckled in a mode wherein the beam adopts an S or Z shape, and the pallet lever mechanism including a pivot forcing the beam to have a node at the middle thereof, and wherein the at least one element includes two prestressed buckled beams, and a third beam fixed to the structure forces the beam formed of the two beams to deform in the second mode, and wherein the third beam forms the pivot.

18. The pallet lever mechanism according to claim 17, wherein the at least one flexible element is made of silicon, and includes a frame including pouches of silicon oxide $SiO_2$ which prestress the two beams.

19. A pallet lever mechanism for an escapement mechanism comprising:

at least one fixed structure carrying a balance and an escape wheel cooperating with each other, the pallet lever mechanism configured to limit or to transmit angular travel of the balance and/or of the escape wheel, the pallet lever mechanism including pallet stones cooperating with the escape wheel, and at least one flexible, multistable element, wherein cooperation of the pallet lever mechanism with the balance is achieved by horns of a first portion of the pallet lever mechanism, the first portion being connected by the at least one the flexible element to a second portion of the pallet lever mechanism carrying the pallet stones, the at least one flexible element including at least one prestressed beam buckled in a mode wherein the beam adopts an S or Z shape, and the pallet lever mechanism including a pivot forcing the beam to have a node at the middle thereof, and wherein the at least one flexible element is made of silicon, and includes a parallel structure including a set of parallel beams which are oxidized and ensure bending and buckling of a flexible element to be prestressed formed by at least one the beam, buckling resistance of the parallel structure being greater than that of the flexible element to be prestressed.

20. A pallet lever mechanism for an escapement mechanism comprising:

at least one fixed structure carrying a balance and an escape wheel cooperating with each other, the pallet lever mechanism configured to limit or to transmit angular travel of the balance and/or of the escape wheel, the pallet lever mechanism including pallet stones cooperating with the escape wheel, and at least one flexible, multistable element, wherein cooperation of the pallet lever mechanism with the balance is achieved by horns of a first portion of the pallet lever mechanism, the first portion being connected by the at least one flexible element to a second portion of the pallet lever mechanism carrying the pallet stones, the at least one flexible element including at least one prestressed beam buckled in a mode wherein the beam adopts an S or Z shape, and the pallet lever mechanism including a pivot forcing the beam to have a node at the middle thereof, and wherein a structure of the first portion and/or of the second portion of the pallet lever mechanism includes a central single crystal quartz core, which is coated on the upper and lower surfaces thereof with a deposition having a coefficient $\alpha$ lower than the coefficient $\alpha_{x,y}$ of quartz, which is 7.5 ppm/° C.

* * * * *